US011482658B1

(12) United States Patent
Squires et al.

(10) Patent No.: US 11,482,658 B1
(45) Date of Patent: Oct. 25, 2022

(54) PIEZOELECTRIC ROTARY OPTICAL MOUNT

(71) Applicant: Government of the United States, as represented by the Secretary of the Air Force, Kirtland AFB, NM (US)

(72) Inventors: Matthew Squires, Sandia Park, NM (US); Estevan Nunez, Albuquerque, NM (US); Benjamin Watson, Yuma, AZ (US); Cole Yarbrough, San Francisco, CA (US); Brian Kasch, Albuquerque, NM (US)

(73) Assignee: Government of the United States as represented by the Secretary of the Air Force, Kirtland AFB, NM (US)

( * ) Notice: Subject to any disclaimer, the term of this patent is extended or adjusted under 35 U.S.C. 154(b) by 867 days.

(21) Appl. No.: 16/001,746

(22) Filed: Jun. 6, 2018

(51) Int. Cl.
| | |
|---|---|
| *G02B 7/04* | (2021.01) |
| *H01L 41/053* | (2006.01) |
| *H01L 41/23* | (2013.01) |
| *H02N 2/10* | (2006.01) |
| *G02B 7/00* | (2021.01) |

(52) U.S. Cl.
CPC ............ *H01L 41/053* (2013.01); *G02B 7/005* (2013.01); *H01L 41/23* (2013.01); *H02N 2/101* (2013.01)

(58) Field of Classification Search
CPC ....... H01L 41/053; H01L 41/23; G02B 7/005; H02N 2/101
See application file for complete search history.

(56) References Cited

U.S. PATENT DOCUMENTS

| | | |
|---|---|---|
| 3,320,580 A | 5/1967 | Sykes |
| 3,902,085 A | 8/1975 | Bizzigotti |
| 4,453,103 A | 6/1984 | Vishnevsky et al. |
| 4,525,852 A | 6/1985 | Rosenberg |
| 4,594,584 A | 6/1986 | Pfeiffer et al. |
| 4,607,166 A | 8/1986 | Tamaki |
| 4,622,483 A | 11/1986 | Staufenberg, Jr. et al. |
| 4,647,808 A | 3/1987 | Shibuya |
| 4,714,855 A | 12/1987 | Fujimoto |
| 4,727,278 A | 2/1988 | Staufenberg, Jr. et al. |
| 4,775,815 A | 10/1988 | Heinz |
| 4,831,306 A | 5/1989 | Staufenberg, Jr. et al. |
| 4,857,793 A | 8/1989 | Okuno |
| 4,933,590 A | 6/1990 | Inoue et al. |
| 4,975,615 A | 12/1990 | Katahara |
| 5,017,820 A | 5/1991 | Culp |

(Continued)

*Primary Examiner* — Bryan P Gordon
(74) *Attorney, Agent, or Firm* — David L Narciso; AFNWC/JA

(57) ABSTRACT

A piezoelectric rotary optical mount including a clamp including a first hole to hold a hollow member, wherein a contact between the clamp and the hollow member generates a coefficient of friction; a bias element adjacent to the first hole to apply a force to control rotational movement of the hollow member by adjusting the coefficient of friction; and a piezoelectric element to actuate the bias element to apply the force. The clamp may include a housing body including a first end and a second end, wherein the first hole extends in a first axis through the housing body to accommodate the hollow member; a pair of elongated cutout regions extending from the first hole towards the second end to define the bias element; and a second hole adjacent to at least one of the cutout regions to accommodate the piezoelectric element.

20 Claims, 14 Drawing Sheets

(56) References Cited

U.S. PATENT DOCUMENTS

| | | | |
|---|---|---|---|
| 5,027,028 A | 6/1991 | Skipper | |
| 5,034,647 A | 7/1991 | Ohtsuka | |
| 5,079,471 A | 1/1992 | Nygren | |
| 5,140,470 A | 8/1992 | Luecke | |
| 5,410,206 A | 4/1995 | Luecke et al. | |
| 6,806,620 B1 | 10/2004 | Wischnewskiy | |
| 7,116,037 B2 | 10/2006 | Moteki et al. | |
| 2003/0226990 A1* | 12/2003 | Waterfield | H01L 41/0533 251/129.06 |
| 2004/0022943 A1* | 2/2004 | Schlaf | B82Y 40/00 427/249.1 |
| 2010/0290138 A1* | 11/2010 | Thomas | G02B 7/08 359/824 |
| 2011/0317287 A1* | 12/2011 | Aoki | G02B 7/08 359/813 |

* cited by examiner

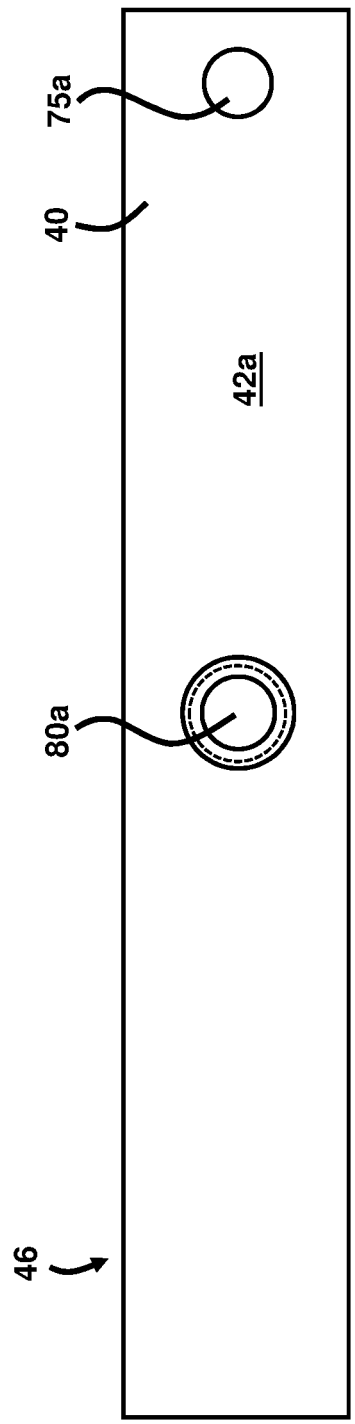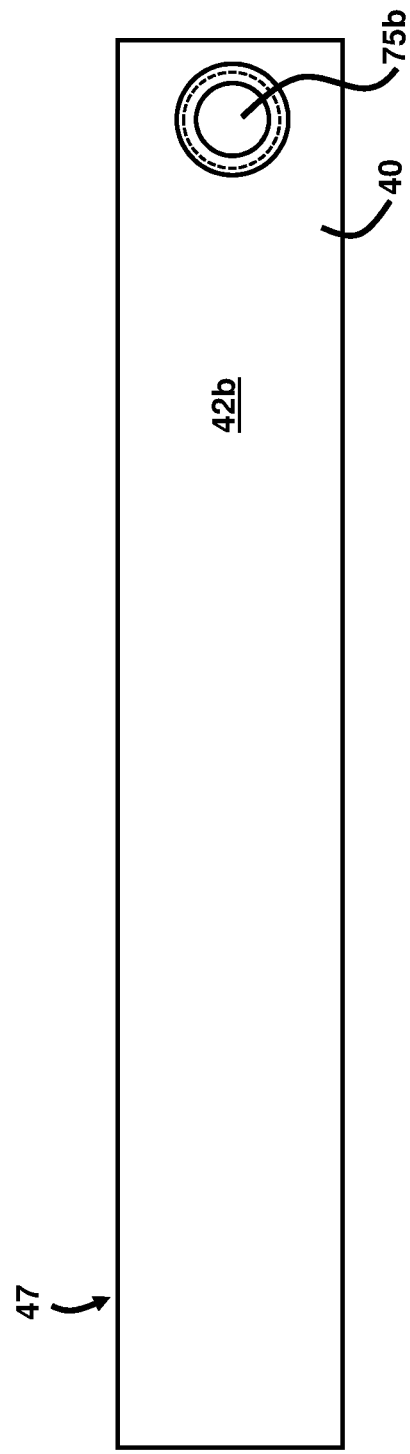

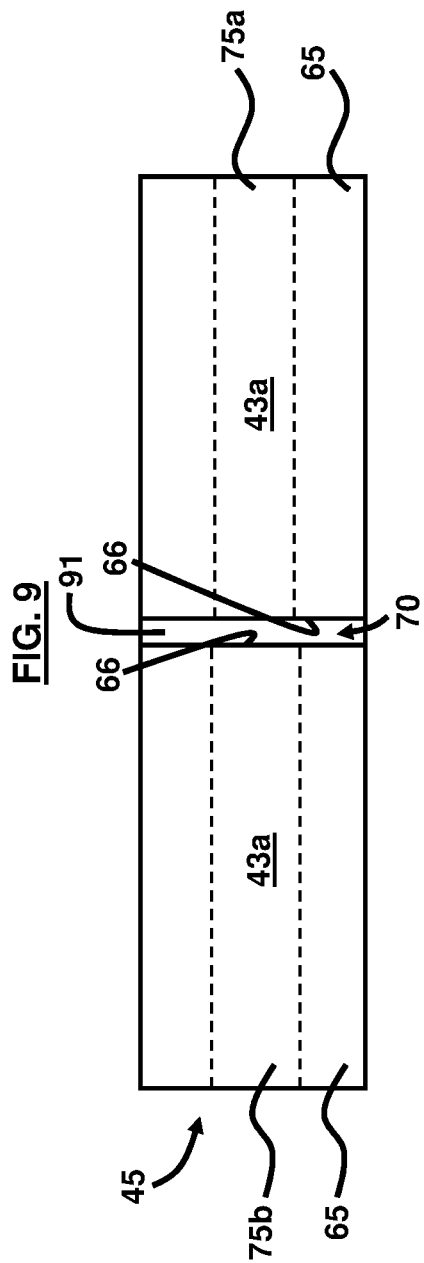
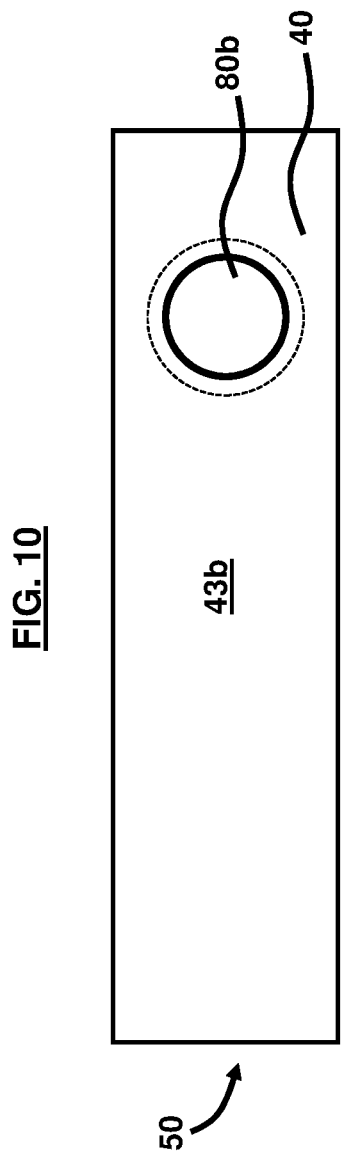

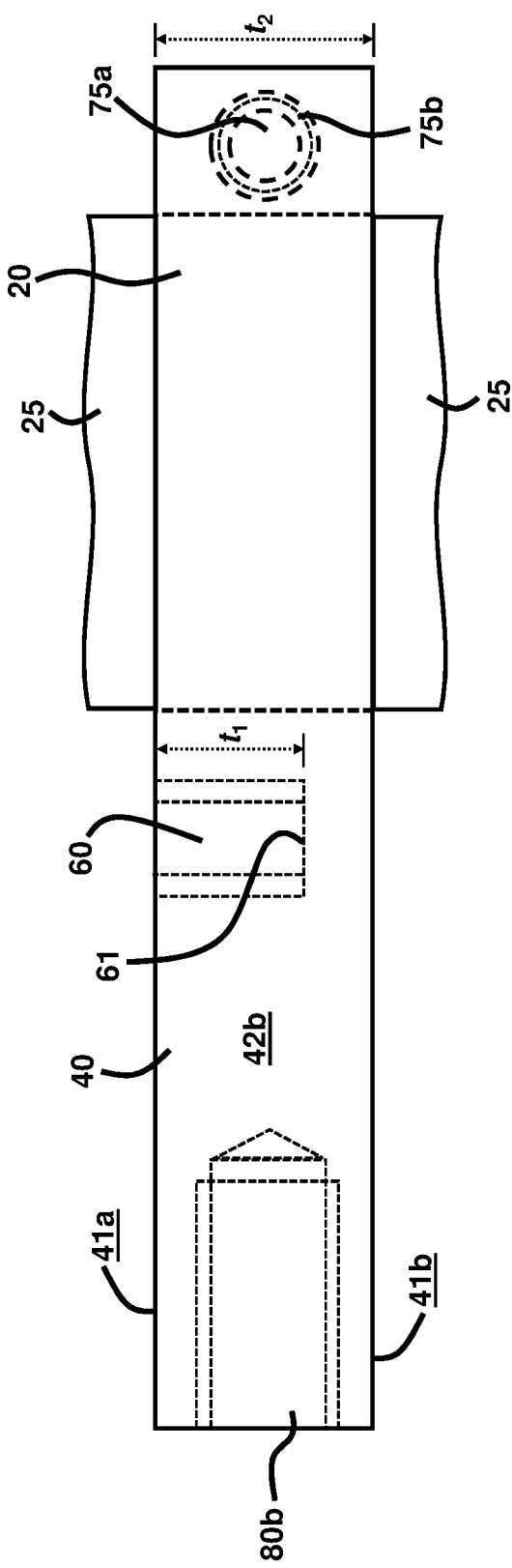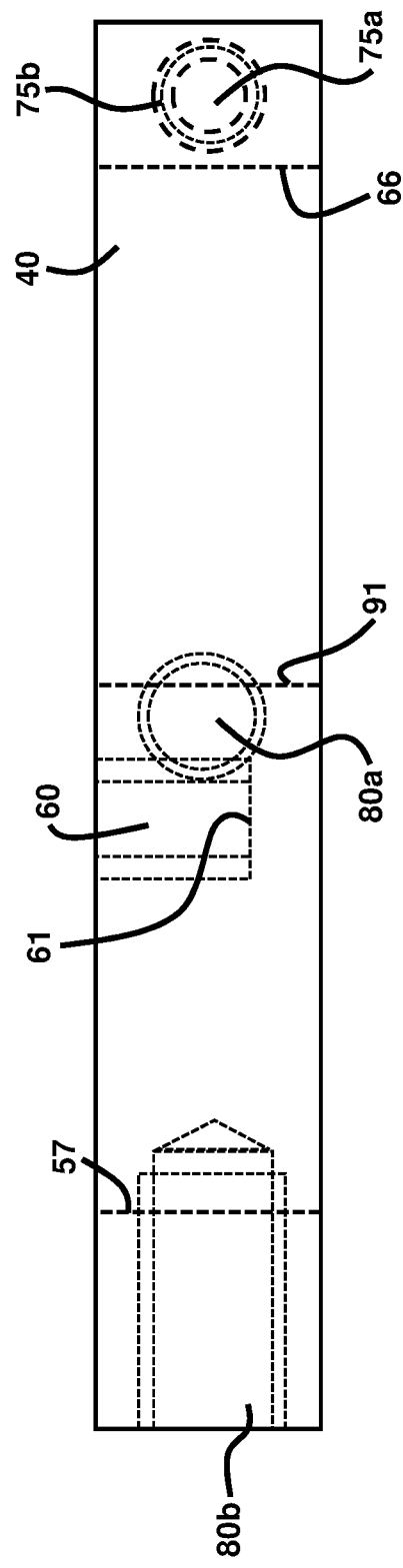

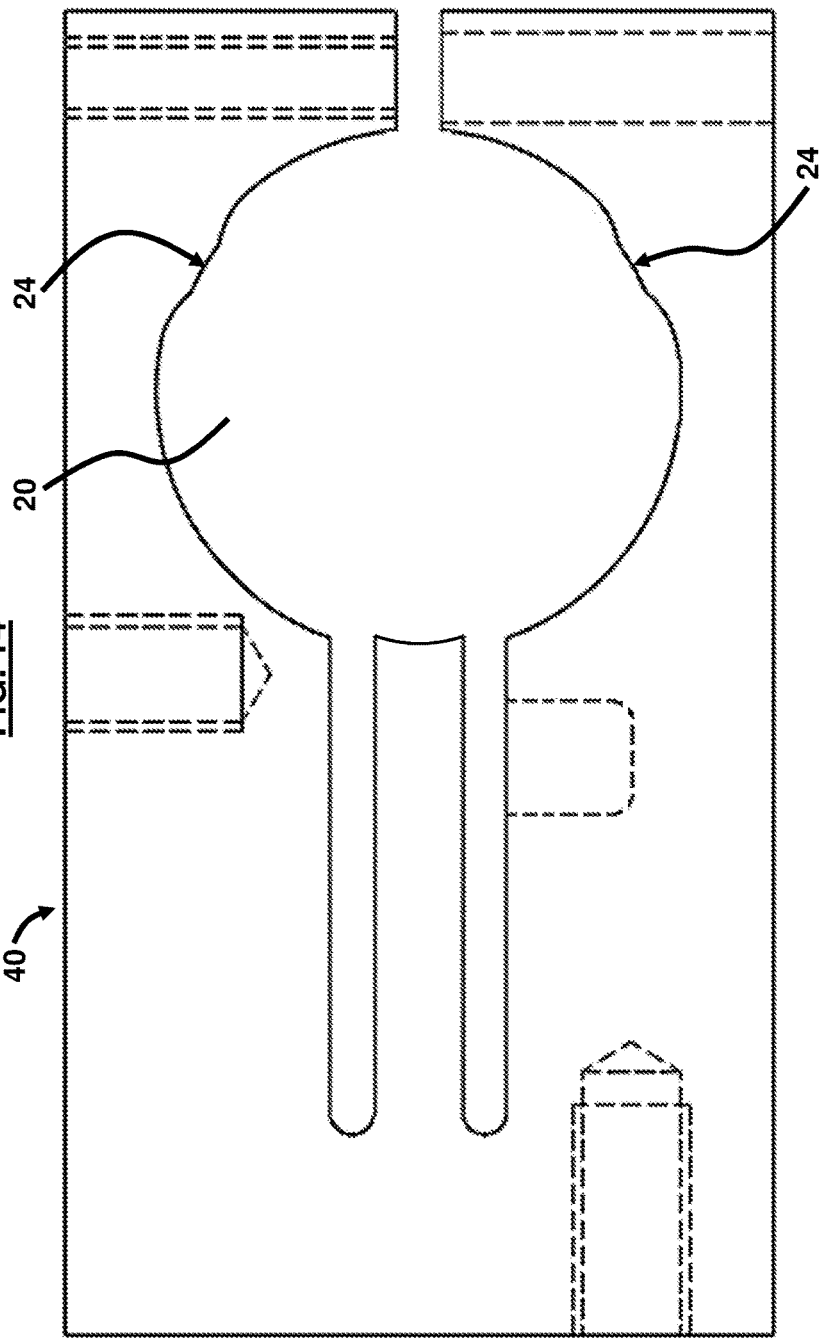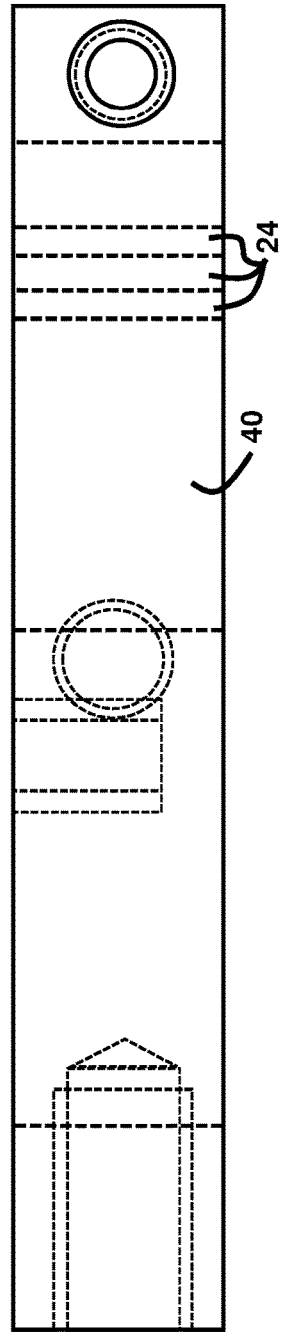

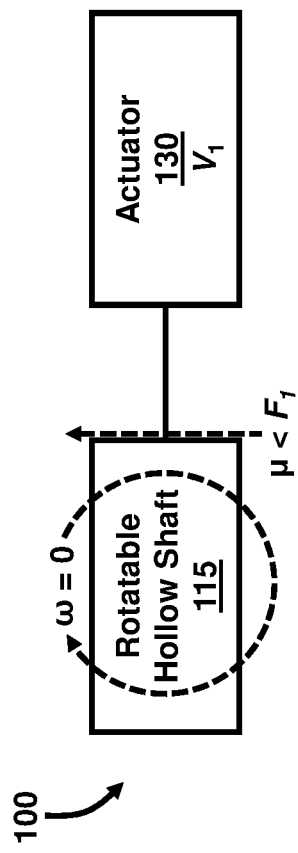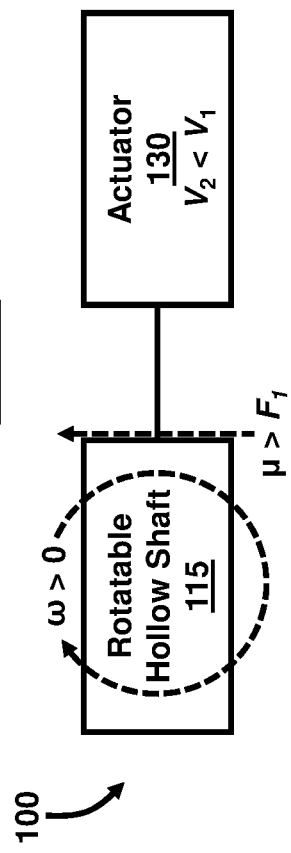

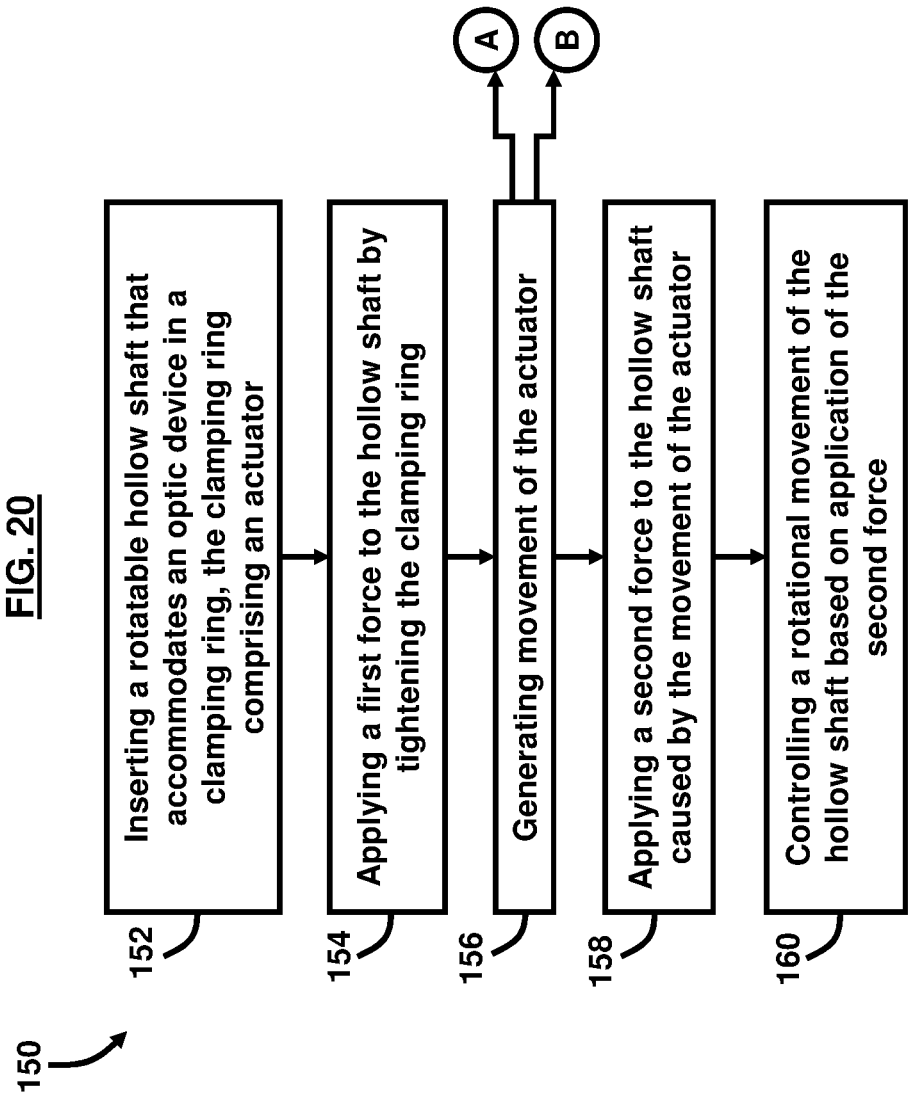

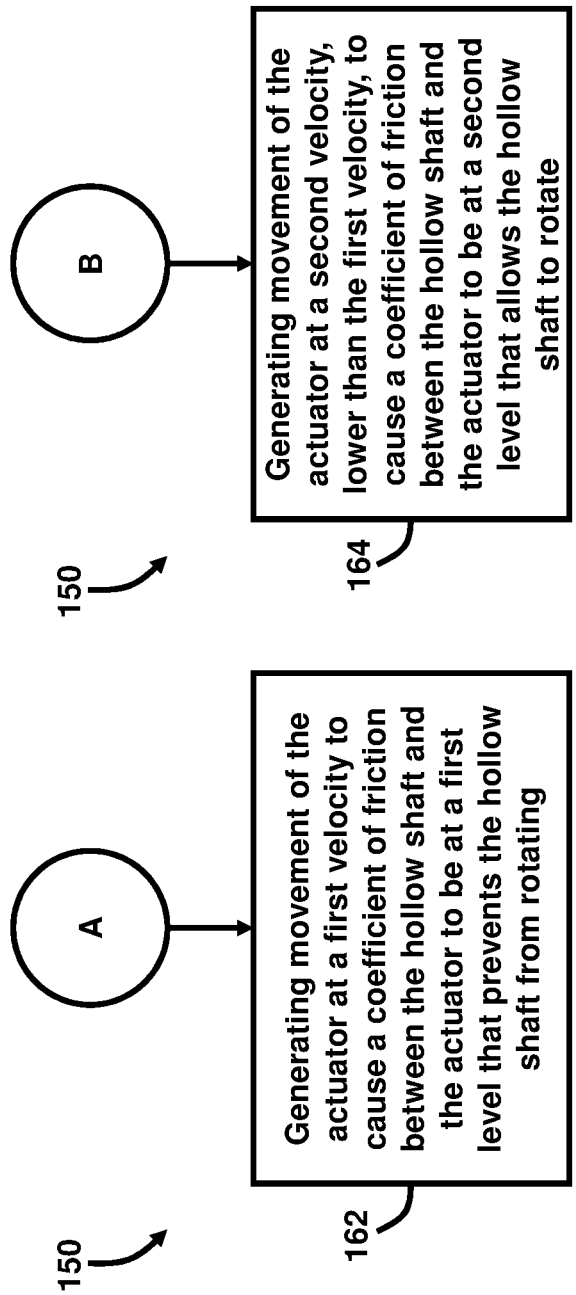

PIEZOELECTRIC ROTARY OPTICAL MOUNT

GOVERNMENT INTEREST

The invention described herein may be manufactured and used by or for the Government of the United States for all government purposes without the payment of any royalty.

BACKGROUND

Field of the Invention

The embodiments herein generally relate to motion control systems, and more particularly to mounts for holding piezoelectric actuation devices.

Background of the Invention

Piezoelectric driven mechanisms are actuation devices for screws and linear-type motors. They are based on the principle that the coefficients of static and dynamic friction are different. Various types of mechanisms such as lenses, mirrors, and prisms, etc. may be adjustably mounted in an optical system. An adjustable optical mount may secure these mechanisms to permit the orientation of the optical element to be adjusted in a desired manner. Sometimes, a piezoelectric actuation device rotates adjustment screws of the optical system. Some systems include jaw-like clamps, whereby a reciprocating motion of abutting jaws against a threaded shaft is converted to a rotational motion of the threaded shaft. This rotational motion of the threaded shaft results in translational motion of the threaded shaft and respective movement of a component connected to the optical system.

Conventional slip/stick actuators operate with a small solid or threaded shaft, which typically do not allow for an integrated optic to be used therewith. The threaded shaft can be used to drive a traditional rotary mount. Other rotary mounts use a drive screw to move a disk, and vibratory rotary mounts can be used in camera lenses to move optical elements. However, these conventional methods are based on a traveling acoustic wave and are not readily available for commercial use due to their complex structures, high cost, and intricate designs. Moreover, conventional optical mount systems typically are not suitable for miniature systems requiring ultraprecision during the alignment process.

BRIEF SUMMARY OF THE INVENTION

In view of the foregoing, an embodiment herein provides a piezoelectric rotary optical mount comprising a clamp comprising a first hole to hold a hollow member, wherein a contact between the clamp and the hollow member generates a coefficient of friction; a bias element adjacent to the first hole to apply a force to control rotational movement of the hollow member by adjusting the coefficient of friction; and a piezoelectric element to actuate the bias element to apply the force. The clamp may comprise a housing body comprising a first end and a second end, wherein the first hole extends in a first axis through the housing body to accommodate the hollow member; a pair of elongated cutout regions extending from the first hole towards the second end to define the bias element; and a second hole adjacent to at least one of the cutout regions to accommodate the piezoelectric element.

The clamp may comprise a pair of prongs at the first end of the housing body; a gap between the pair of prongs extending to the first hole; and a bifurcated third hole extending through the pair of prongs in a second axis through the housing body, wherein the first axis is transverse to the second axis. The clamp may comprise at least a plurality of apertures in the housing body that do not extend through the housing body.

The piezoelectric rotary optical mount may comprise a tightening mechanism positioned in the bifurcated third hole to control any of a size of the gap, a size of the first hole, and a contact force between the clamp and the hollow member. The bias element may comprise an elongated component positioned between the pair of elongated cutout regions and extending from the second end to the first hole. The piezoelectric element may be set to push against the elongated component to generate the coefficient of friction with respect to the hollow member. The elongated component may be set to actuate at different velocities to alter the coefficient of friction to control the rotational movement of the hollow member. The hollow member may be set to accommodate any of an optic device, a cable, a hose, and a screw.

Another embodiment provides motion control system comprising a rotatable hollow shaft to accommodate an optic device; a clamping ring surrounding and applying a first force to the hollow shaft; an actuator adjacent to the hollow shaft and attached to the clamping ring, the actuator to apply a second force to the hollow shaft; and a piezoelectric element to drive actuation of the actuator to generate the second force. The first force may comprise a static force. The second force may comprise a dynamic force. The hollow shaft may be set to move when the second force is greater than the first force.

The motion control system may comprise a mechanism to generate the first force. The mechanism may comprise a screw to adjust a positioning of the clamping ring against the hollow shaft and control the first force. The mechanism may comprise a spring to control the first force. Movement by the actuator at a first velocity may cause a coefficient of friction between the hollow shaft and the actuator to be a kinetic coefficient of friction that is less than the first force thereby preventing the hollow shaft from rotating. Movement by the actuator at a second velocity, lower than the first velocity, may cause a coefficient of friction between the hollow shaft and the actuator to be a static coefficient of friction that is greater than the first force thereby allowing the hollow shaft to rotate.

Another embodiment provides a method comprising inserting a rotatable hollow shaft that accommodates an optic device in a clamping ring, the clamping ring comprising an actuator; applying a first force to the hollow shaft by tightening the clamping ring; generating movement of the actuator; applying a second force to the hollow shaft caused by the movement of the actuator; and controlling a rotational movement of the hollow shaft based on application of the second force. The method may comprise generating movement of the actuator at a first velocity to cause a coefficient of friction between the hollow shaft and the actuator to be at a first level that prevents the hollow shaft from rotating; or generating movement of the actuator at a second velocity, lower than the first velocity, to cause a coefficient of friction between the hollow shaft and the actuator to be at a second level that allows the hollow shaft to rotate.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 7 is a schematic diagram illustrating a first side view of the housing body of FIG. 6, according to an embodiment herein;

FIG. 8 is a schematic diagram illustrating a second side view of the housing body of FIG. 6, according to an embodiment herein;

FIG. 9 is a schematic diagram illustrating a first end view of the housing body of FIG. 6, according to an embodiment herein;

FIG. 10 is a schematic diagram illustrating a second end view of the housing body of FIG. 6, according to an embodiment herein;

FIG. 11 is a schematic diagram illustrating a cross-sectional second side view of the housing body of FIG. 6, according to an embodiment herein;

FIG. 12 is a schematic diagram illustrating another cross-sectional second side view of the housing body of FIG. 6, according to an embodiment herein;

FIG. 14 is a schematic diagram illustrating a cross-sectional top view of the housing body of FIG. 13, according to an embodiment herein;

FIG. 15 is a schematic diagram illustration a cross-sectional side view of the housing body of FIG. 13, according to an embodiment herein;

FIG. 18 is a block diagram of a motion control system for preventing rotation of a hollow shaft, according to an embodiment herein;

FIG. 19 is a block diagram of a motion control system for permitting rotation of a hollow shaft, according to an embodiment herein;

FIG. 20 is a flow diagram illustrating a method, according to an embodiment herein;

FIG. 21A is a flow diagram illustrating a first method of generating movement of an actuator according to the method of FIG. 20, according to an embodiment herein; and FIG. 21B is a flow diagram illustrating a second method of generating movement of an actuator according to the method of FIG. 20, according to an embodiment herein.

DETAILED DESCRIPTION OF THE INVENTION

Figure 1:
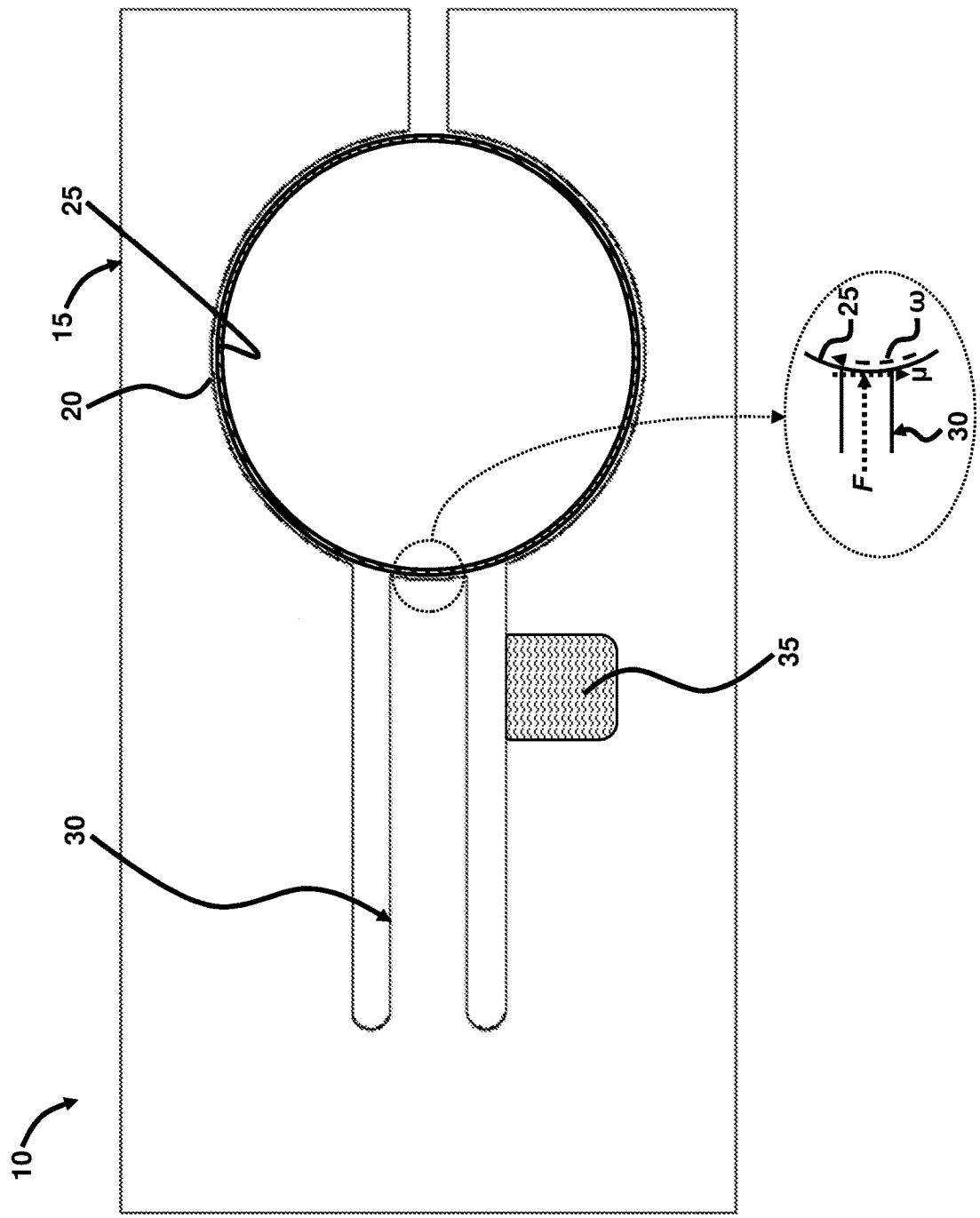
FIG. 1 is a schematic diagram illustrating a top view of a piezoelectric rotary optical mount, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

In the drawings, the size and relative sizes of layers and regions may be exaggerated for clarity. The embodiments herein provide a piezoelectric rotary optical mount that includes a clamp that tightens against a hollow shaft that accommodates an optic device, hose, cable, etc. The hollow shaft is capable of rotating and the clamp restricts the rotation. A piezoelectric element is attached to the clamp and is used to actuate a flexure member such as a spring, which acts as an actuator that contacts the hollow shaft. When the actuator contacts the hollow shaft, it creates a coefficient of friction and if the coefficient of friction is less than the tightening force the hollow shaft does not rotate. However, if the coefficient of friction is greater than the tightening force, then the hollow shaft will rotate with the actuator. The amount of applied force on the actuator is controlled by the piezoelectric element. Referring now to the drawings, and more particularly to FIGS. 1 through 21B, where similar reference characters denote corresponding features consistently throughout, there are shown exemplary embodiments.

Figure 2:
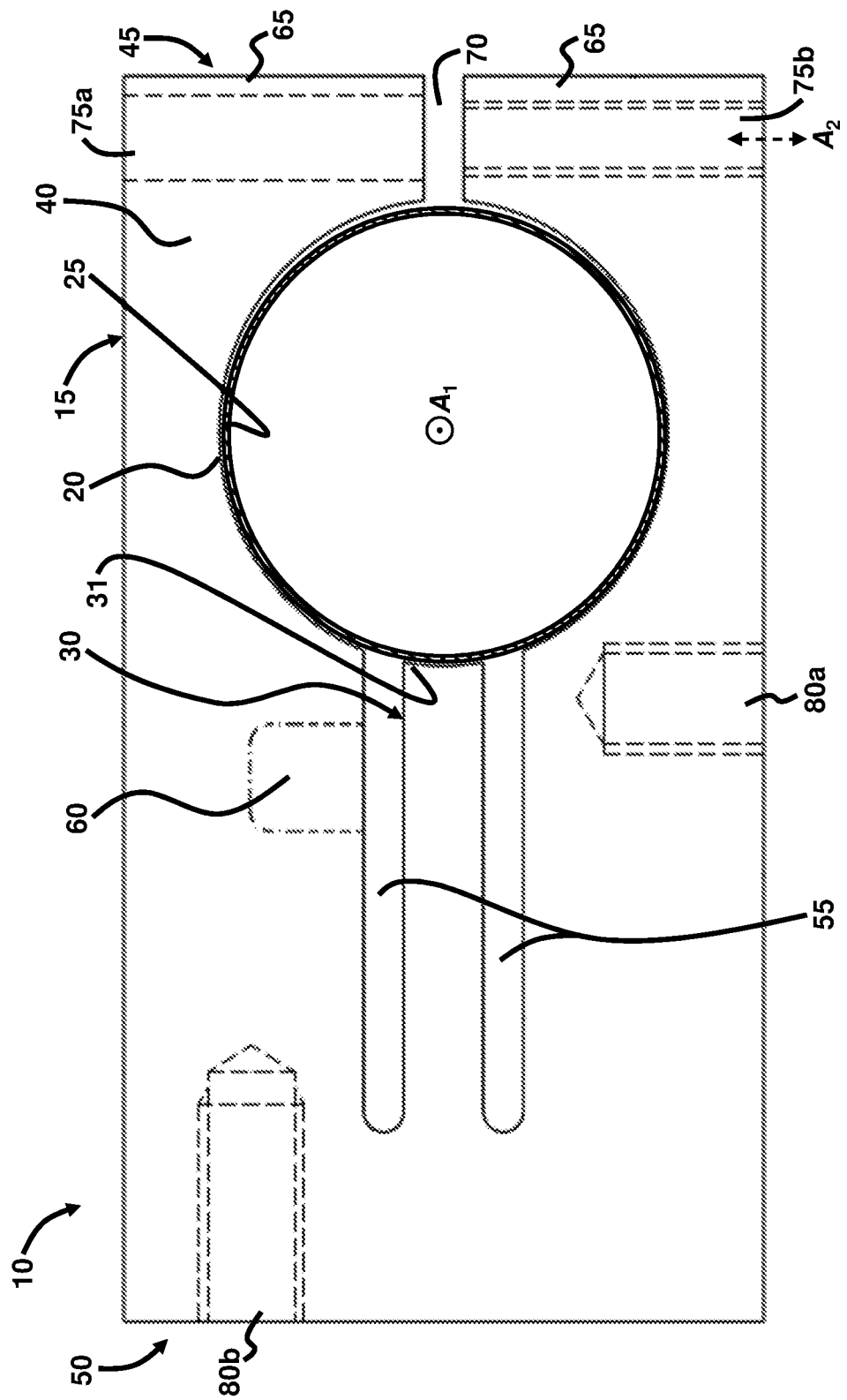
FIG. 2 is a schematic diagram illustrating a bottom view of a piezoelectric rotary optical mount, according to an embodiment herein.

FIG. 1 illustrates a piezoelectric rotary optical mount 10 comprising a clamp 15 comprising a first hole 20 to hold a hollow member 25, wherein a contact between the clamp 15 and the hollow member 25 generates a coefficient of friction μ. In some examples, the clamp 15 may be made of any of a variety of materials including metals and plastics, such as aluminum, polyimides, polymers, nylon, brass, graphite, and steel, etc. The clamp 15 may bend or otherwise compress against the hollow member 25, according to an example. The first hole 20 is suitably sized to permit rotation of the hollow member 25. In an example, the hollow member 25 may be configured as a shaft, tube, or other similarly configured longitudinal member, and is further configured to rotate within the first hole 20, and which permits light or any suitably-sized object to pass therethrough. The hollow member 25 may comprise any suitable material such as aluminum or brass, according to various examples. A bias element 30 is adjacent to the first hole 20 to apply a force F to control rotational movement w of the hollow member 25 by adjusting the coefficient of friction μ. The bias element 30 provides a constant force F on the hollow member 25 without causing material creep or structural hysteresis on the hollow member 25. In an example, the bias element 30 may be configured as a cantilever structure, which rests against a hollow member 25 when inserted in the first hole 20. A piezoelectric element 35 is provided to actuate the bias element 30 to apply the force F. The hollow member 25 is capable of rotating and the clamp 15 restricts the rotation. The bias element 30, which is driven by the piezoelectric element 35, contacts the hollow member 25. When the bias element 30 contacts the hollow member 30, it creates the coefficient of friction μ, and if the coefficient of friction μ is less than the force F, the hollow member 25 does not rotate. However, if the coefficient of friction μ is greater than the force F, then the hollow member 25 will rotate with the bias element 30. The amount of applied force F on the bias element 30 is controlled by the piezoelectric element 35. While FIG. 1 depicts the force F to be a normal force applied against the hollow member 25, other types of forces may be applied by the bias element 30 to create contact between the clamp 15 and the hollow member 25. For example, the force F may be a bending force, torque, moment, vibration, oscillatory, etc. causing a bending displacement of the bias element 30 to contact the hollow member 25 to create the sufficient coefficient of friction μ. In an example, the bias element 30 comprises a slightly curved end surface 31, as best shown in FIG. 2, and any lateral bending of the bias element 30 causes the hollow member 25 to contact the slightly curved end surface 31 of the bias element 30, thereby creating or enhancing the coefficient of friction μ. In an example, the piezoelectric element 35 may be any type of piezoelectric actuator, transducer, controller, or device used to actuate movement of the bias element 30. The piezoelectric rotary optical mount 10 is configured to operate without requiring it to be energized or requiring electrical or electromagnetic power in order to hold its position within an overall system (not shown).

As shown in FIG. 2, with reference to FIG. 1, the clamp 15 may comprise a housing body 40 comprising a first end 45 and a second end 50, wherein the first hole 20 extends in a first axis $A_1$ through the housing body 40 to accommodate the hollow member 25. A pair of elongated cutout regions 55 is provided extending from the first hole 20 towards the second end 50 to define the bias element 30. A second hole 60 is configured in the housing body 40 adjacent to at least one of the cutout regions 55 to accommodate the piezoelectric element 35. In an example, the second hole 60 does not extend through the entire thickness of the housing body 40 to permit the piezoelectric element 35 to be properly seated and retained in the second hole 60 and, thus, retained in the housing body 40. By contrast, each of the first hole 20 and the pair of elongated cutout regions 55 extend through the entire thickness of the housing body 40 to permit the hollow member 25 to extend through the first hole 20 and permit the bias element 30 to be deflectable, respectively. In other examples, the second hole 60 may extend through the housing body 40 such that the piezoelectric element 35 is snug-fit in the second hole 60 or retained by a suitable tightening mechanism (not shown) or adhesive.

The clamp 15 may comprise a pair of prongs 65 at the first end 45 of the housing body 40. A gap 70 is configured between the pair of prongs 65 extending to the first hole 20. The gap 70 permits the pair of prongs 65 to be compressed in a clamping manner against the hollow member 25 to further control rotation of the hollow member 25, if desired. A bifurcated third hole 75a, 75b is provided extending through the pair of prongs 65 in a second axis $A_2$ through the housing body 40, wherein the first axis $A_1$ is transverse to the second axis $A_2$, according to an example. The gap 70 separates the prongs 65 and, thus, separates hole 75a from hole 75b. The bifurcated third hole 75a, 75b may comprise a uniform radius or hole 75a may have a different radius than hole 75b to accommodate a suitably configured complementary retaining mechanism, as further described below. Irrespective of the corresponding radii of the bifurcated third hole 75a, 75b and the positioning of the gap 70, the bifurcated third hole 75a, 75b is in a substantially and axially aligned configuration.

The clamp 15 may comprise at least a plurality of apertures 80a, 80b in the housing body 40 that do not extend through the housing body 40. The plurality of apertures 80a, 80b may be suitably configured to accommodate retentions mechanism (not shown) such as screws, bolts, rods, and pins, etc., which may be used to retain the piezoelectric rotary optical mount 10 with other sub-system components (not shown) of an optical system (not shown).

Figure 3:
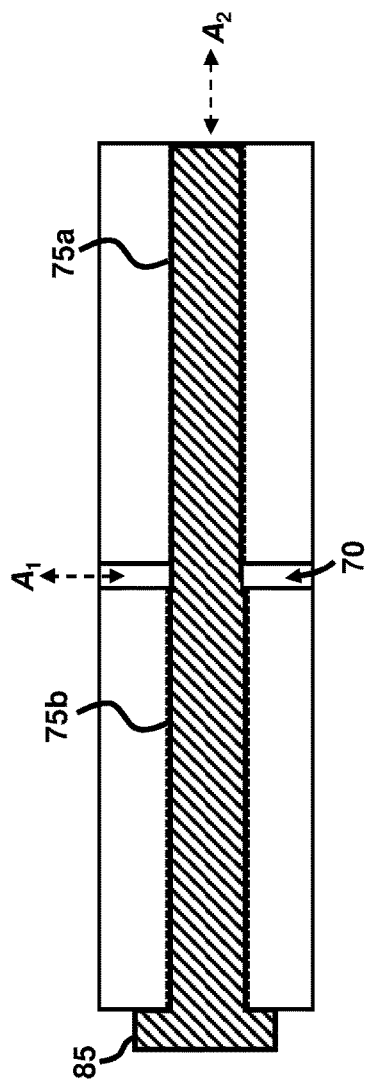
FIG. 3 is a schematic diagram illustrating a cross-sectional front view of a piezoelectric rotary optical mount, according to an embodiment herein.
Figure 4:
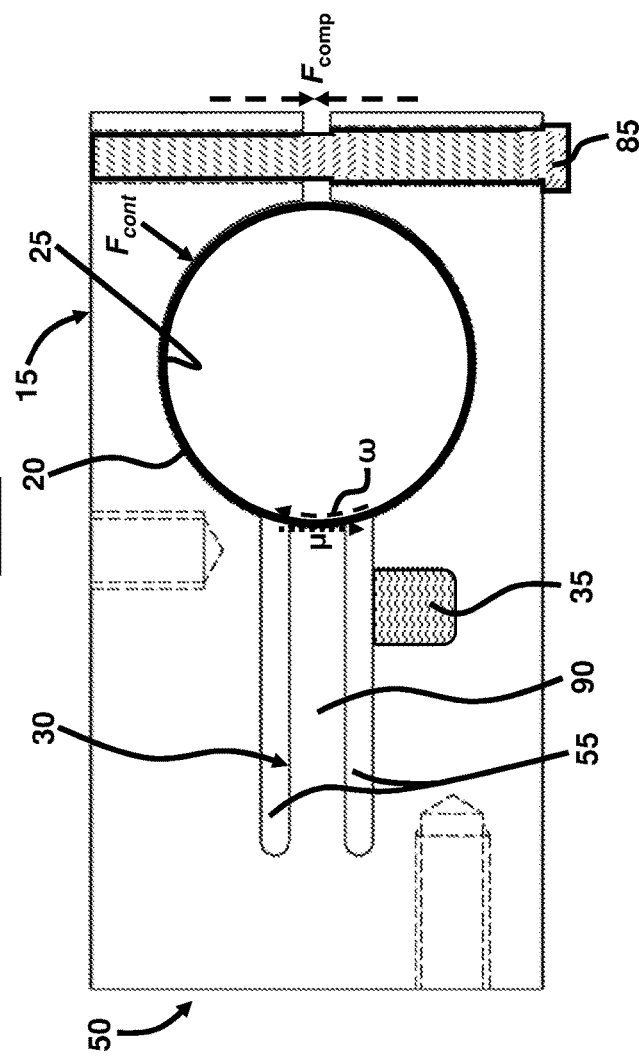
FIG. 4 is a schematic diagram illustrating another top view of the piezoelectric rotary optical mount of FIG. 1, according to an embodiment herein.
Figure 5D:
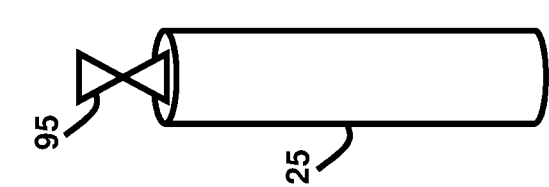
FIG. 5D is a schematic diagram illustrating a hollow member receiving a screw, according to an embodiment herein.
Figure 5C:
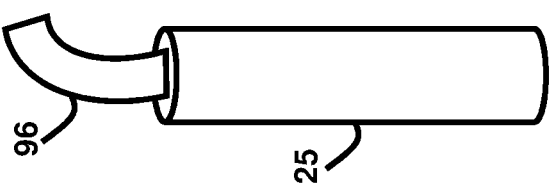
FIG. 5C is a schematic diagram illustrating a hollow member receiving a hose, according to an embodiment herein.
Figure 5B:
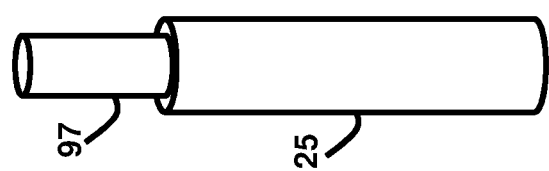
FIG. 5B is a schematic diagram illustrating a hollow member receiving a cable, according to an embodiment herein.
Figure 5A:
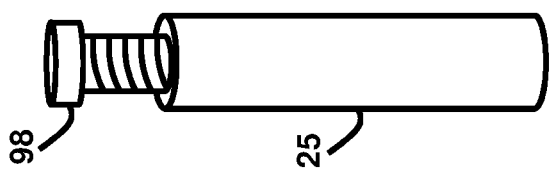
FIG. 5A is a schematic diagram illustrating a hollow member receiving an optic device, according to an embodiment herein.

As shown in FIGS. 3 and 4, with reference to FIGS. 1 and 2, the piezoelectric rotary optical mount 10 may further comprise a tightening mechanism 85 positioned in the bifurcated third hole 75a, 75b to control any of a size of the gap 70, a size of the first hole 20, and a contact force $F_{cont}$ between the clamp 15 and the hollow member 25. The tightening mechanism 85 may include any suitable component such as a spring, screw, or bolt, etc. and may be threaded. If the tightening mechanism 85 is threaded, then the bifurcated third hole 75a, 75b is similarly threaded in a complementary manner to engage the tightening mechanism 85. In another example, the tightening mechanism 85 may be a push-pin that does not require threads, and as such the bifurcated third hole 75a, 75b is similarly unthreaded. The clamp 15 may be compressed by compressing the tightening mechanism 85, which creates a compression force $F_{comp}$ with respect to the prongs 65, which further restricts rotational movement w of the hollow member 25 within the first hole 20. Such action in conjunction with the engagement of the bias member 30 against the hollow member 25 creates the coefficient of friction μ.

The bias element 30 may comprise an elongated component 90 positioned between the pair of elongated cutout regions 55 and extending from the second end 50 to the first hole 20. The elongated component 90 may be a cantilever structure, which acts as a spring that freely bends with respect to the housing body 40 upon actuation by the piezoelectric element 35. The elongated component 90 is sufficiently elastic to allow it to move upon being actuated by the piezoelectric component 35 without becoming permanently deformed and/or fracturing. In this regard, the piezoelectric element 35 may be set to push against the elongated component 90 to generate the coefficient of friction μ with respect to the hollow member 25. While the figures show the second hole 60 and piezoelectric element 35 on only one side of the pair of elongated cutout regions 55, the housing body 40 may be configured to have a second hole 60 and piezoelectric element 35 on each side of the elongated cutout regions 55, or to have multiple second holes 60 and piezoelectric elements 35 on any of the sides of the elongated cutout regions 55.

According to various examples, the elongated component 90 may be set to actuate at different velocities to alter the coefficient of friction μ to control the rotational movement w of the hollow member 25. The actuation at different velocities is controlled by the piezoelectric element 35, which may be pre-programmed or may be communicatively controlled by a computer or other processing device (not shown) during use of the piezoelectric rotary optical mount 10. When the piezoelectric element 35 is turned on it expands to contact the elongated component 90, thereby actuating the elongated component 90.

FIGS. 5A through 5D, with respect to FIGS. 1 through 4, are schematic diagrams illustrating the hollow member 25 receiving or accommodating any of an optic device 95, a cable 96, a hose 97, and a screw (e.g., drive screw) 98, according to various embodiments herein. The piezoelectric rotary optical mount 10 may accommodate the hollow member 25 for manipulating prisms, waveplates, cylindrical lenses, filters, etc. The hollow member 25 may be used to allow signals and fluids, etc. to pass therethrough. Other components may also be inserted through the hollow member 25 depending on the application of use of the hollow member 25. In an example, any of the optic device 95, a cable 96, a hose 97, and a screw 98 may be held in place in the hollow member 25 by an epoxy, adhesive, retaining mechanism (i.e., pin, screw, etc.) or may be press fit into place. According to the embodiments herein, the hollow member 25 may rotate at any suitable speed, and the corresponding components (i.e., optic device 95, cable 96, hose 97, and screw 98, etc.) may rotate along with the hollow member 25 or may be free of rotation within the hollow member 25.

Figure 6:
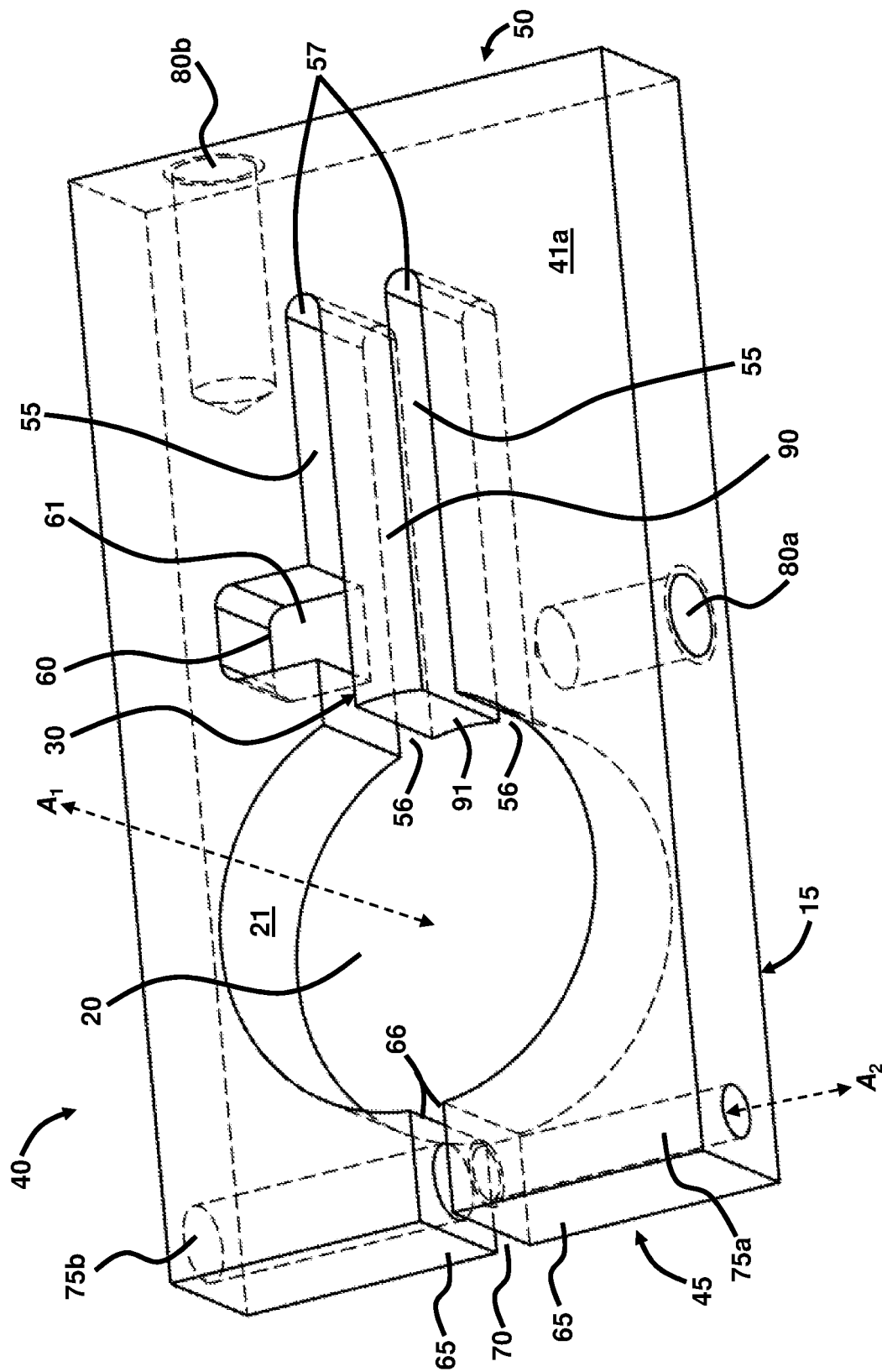
FIG. 6 is a schematic diagram illustrating a housing body of a piezoelectric rotary optical mount, according to an embodiment herein.

FIG. 6, with reference to FIGS. 1 through 5D, is a schematic diagram illustrating the housing body 40 of the piezoelectric rotary optical mount 10, according to an embodiment herein. In the examples shown in the figures, the housing body 40 comprises a substantially rectangular shape. However, the housing body 40 may comprise any suitable shape or configuration. The top of the housing body 40 comprises a substantially planar surface 41a, although a non-planar surface is possible. The first hole 20 comprises a substantially smooth inner wall surface 21 to provide a suitable contact surface for the hollow member 25, although a non-smooth inner wall surface 21 is possible. The gap 70 that separates the pair of prongs 65 creates a pair of inner end walls 66 of the pair of prongs 65. Moreover, the gap 70 is aligned to face a corresponding contact wall 91 of the elongated component 90 of the bias element 30. The contact wall 91 engages the hollow member 25 when the piezoelectric element 35 actuates the elongated component 90. The pair of elongated cutout regions 55 extend from the first hole 20 by way of openings 56 configured in the inner wall surface 21 of the first hole 20. The openings 56 are adjacent to the contact wall 91. The pair of elongated cutout regions 55 extend to a pair of back walls 57, such that the length of the pair of elongated cutout regions 55 is defined by the distance from the openings 56 to the pair of back walls 57. In an example, the pair of elongated cutout regions 55 are of the same length. In another example, the pair of elongated cutout regions 55 are of different lengths. Moreover, the length of the elongated component 90 is similarly defined by the distance from the openings 56 to the pair of back walls 57, or in other words the length of the elongated component 90 is the same as the length of the pair of elongated cutout regions 55, according to an example. As shown in FIG. 6, the second hole 60 comprises a base 61 to provide a seat for the piezoelectric element 35, according to an example.

FIG. 7, with reference to FIGS. 1 through 6, is a schematic diagram illustrating a first side view of the housing body 40 of FIG. 6, according to an embodiment herein. The first side 46 of the housing body 40 may comprise a substantially planar surface 42a, although a non-planar surface is possible. As shown in FIG. 7, hole 75a and aperture 80a are configured in the first side 46. FIG. 8, with reference to FIGS. 1 through 7, is a schematic diagram illustrating a second side view of the housing body 40 of FIG. 6, according to an embodiment herein. The second side 47 of the housing body 40 may comprises a substantially planar surface 42b, although a non-planar surface is possible. As shown in FIG. 8, hole 75b is configured in the second side 47, which aligns with hole 75a of the first side 46 (of FIG. 7) to create the bifurcated third hole 75a, 75b of the housing body 40.

FIG. 9, with reference to FIGS. 1 through 8, is a schematic diagram illustrating a first end view of the housing body 40 of FIG. 6, according to an embodiment herein. The first end 45 of the housing body 40, as shown in FIG. 9, comprises the pair of prongs 65 separated by the gap 70 as defined by the facing pair of inner end walls 66. The pair of prongs 65 may comprise a substantially planar surface 43a, although a non-planar surface is possible. In the view shown in FIG. 9, the contact wall 91 of the elongated component 90 is visible through the gap 70. Furthermore, the dashed lines in FIG. 9 depict the location of the bifurcated third hole 75a, 75b.

FIG. 10, with reference to FIGS. 1 through 9, is a schematic diagram illustrating a second end view of the housing body 40 of FIG. 6, according to an embodiment herein. The second end 50 of the housing body 40 may comprise a substantially planar surface 43b, although a non-planar surface is possible. Furthermore, the aperture 80b is configured in the second end 50, as shown in FIG. 10.

FIG. 11, with reference to FIGS. 1 through 9, is a schematic diagram illustrating a cross-sectional second side view of the housing body 40 of FIG. 6, according to an embodiment herein. The housing body 40 may comprise a substantially planar bottom surface 41b, although a non-planar surface is possible. According to an example, the hollow member 25 extends above/below the surfaces 41a, 41b when the hollow member 25 is inserted into the first hole 20. The second hole 60 is shown with the base 61, which causes the second hole 60 to have a thickness $t_1$ less than the thickness $t_2$ of the housing body 40. As described above, the second hole 60 may be alternatively configured such that it does not contain a base 61, whereby the second hole 60 extends throughout the entire thickness of the housing body 40 such that the thickness $t_1$ is equal to the thickness $t_2$.

FIG. 12 is a schematic diagram illustrating another cross-sectional second side view of the housing body 40 of FIG. 6, according to an embodiment herein. As shown in FIG. 12, the relative positions of the pair of back walls 57, second hole 60, base 61, pair of inner end walls 66, bifurcated third hole 75a, 75b, apertures 80a, 80b, and contact wall 91 are shown, according to an example. However, these relative positions are merely shown as exemplary positions and the housing body 40 may be configured to accommodate any suitable positions for the respective pair of back walls 57, second hole 60, base 61, pair of inner end walls 66, bifurcated third hole 75a, 75b, apertures 80a, 80b, and contact wall 91, as well as the other components of the housing body 40.

Figure 13:
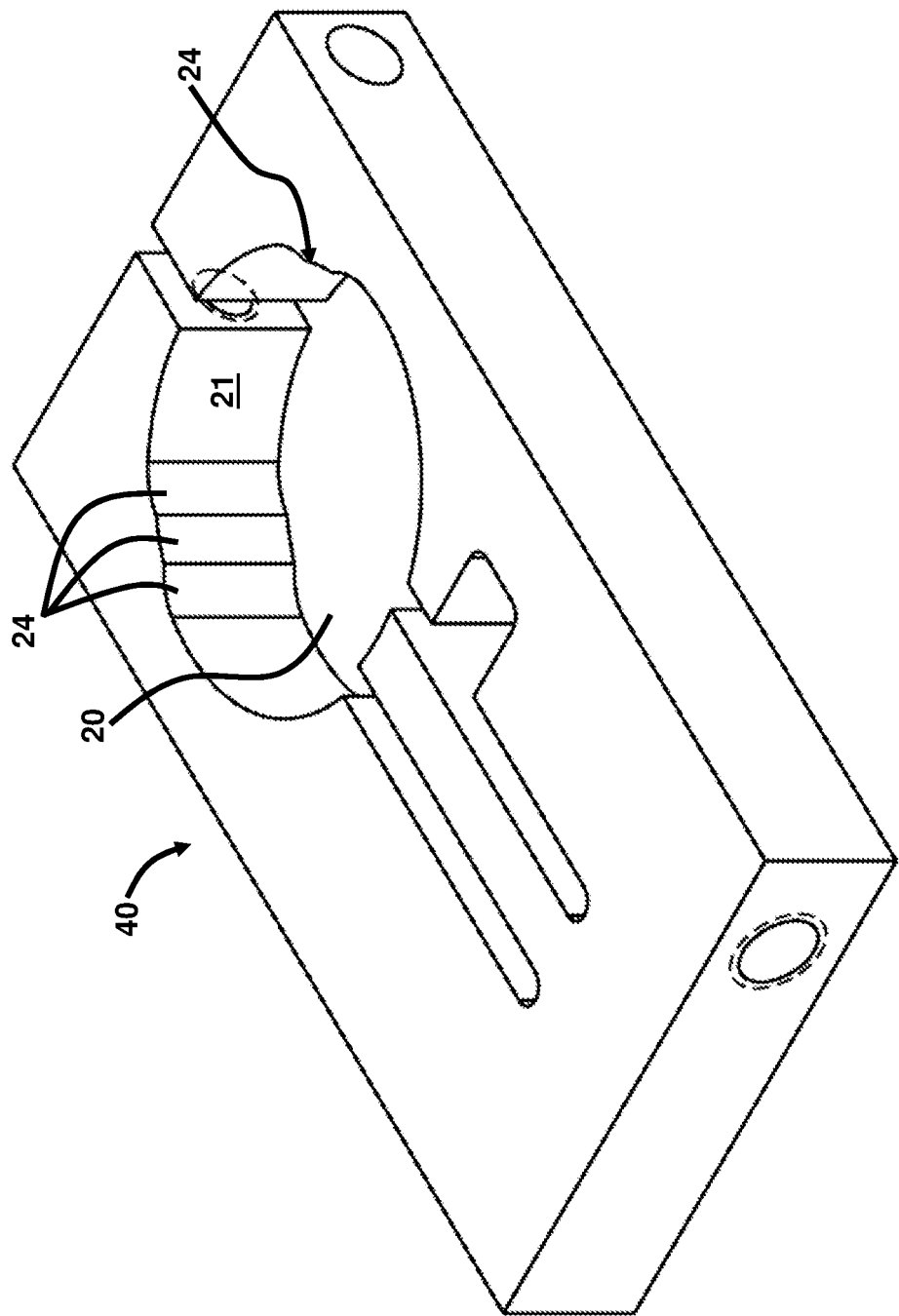
FIG. 13 is a schematic diagram illustrating a perspective view of a housing body of a piezoelectric rotary optical mount with protruding features in the first hole, according to an embodiment herein.

FIG. 13, with reference to FIGS. 1 through 12, is a schematic diagram illustrating a perspective view of a housing body 40 of a piezoelectric rotary optical mount 10 with an alternately configured first hole 20, wherein the first hole 20 comprises protruding features 24 configured on the inner wall surface 21. The protruding features 24 may be configured as one or more protruding portions of the inner wall surface 21, and in an example, there may be two sets of protruding features 24 positioned on substantially opposite sides of the first hole 20, although the two sets of protruding features 24 may be positioned along any suitable portion of the inner wall surface 21. In another example, the protruding features 24 may comprise protruding angled portions of the inner wall surface 21.

FIG. 14, with reference to FIGS. 1 through 13, is a schematic diagram illustrating a cross-sectional top view of the housing body 40 of FIG. 13, according to an embodiment herein, and FIG. 15, with reference to FIGS. 1 through 14, is a schematic diagram illustration a cross-sectional side view of the housing body 40 of FIG. 13, according to an embodiment herein. The protruding features 24 reduce the size of the first hole 20. As such according to an example, the protruding features 24 increase the contact force Font against a hollow member 25 that is inserted in the first hole 20.

Figure 16:
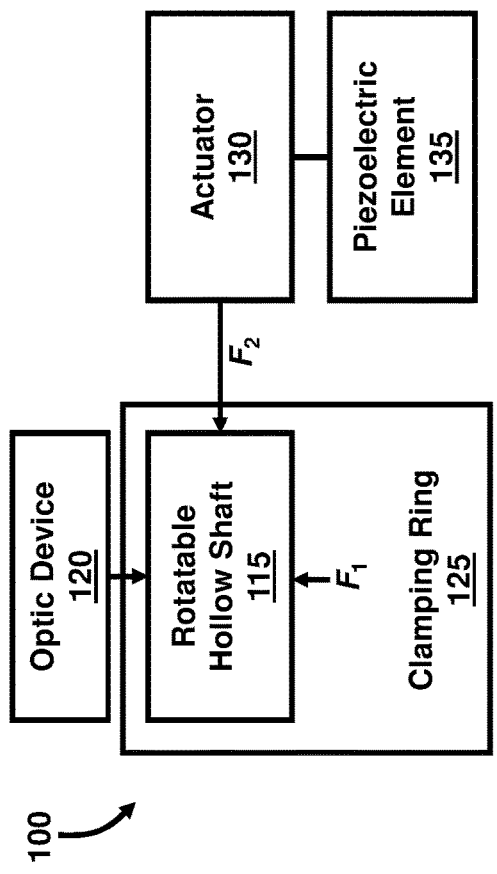
FIG. 16 is a block diagram of a motion control system, according to an embodiment herein.

FIG. 16, with reference to FIGS. 1 through 15, is a block diagram of a motion control system 100 comprising a rotatable hollow shaft 115 to accommodate an optic device 120. A clamping ring 125 is provided surrounding and applying a first force $F_1$ to the hollow shaft 115. The clamping ring 125 is configured to function as a compact rotary mount that can be used during alignment of the optic device 120 and then disconnected or left for long periods of time while the system 100 is in use. In an example, the clamping ring 125 may be used for coupling a laser into a fiberoptic mount using Risley prisms (e.g., a pair of wedge prisms used for beam steering), but could also be used anywhere in an optical system where an alignment is made infrequently and where a more complicated, bulky, or expensive rotary mount would not be suitable. As such, the clamping ring 125 is compact (e.g., approximately less than 0.5 in$^3$), has enhanced resolution to accommodate the enhanced precision required for fine optical alignment, is simple to manufacture, and operates in any application that requires a rotary mount and not only critical locations where rotation is needed on a consistent basis or that where actuation would be difficult.

An actuator 130 is adjacent to the hollow shaft 115 and attached to the clamping ring 125, wherein the actuator 130 is set to apply a second force $F_2$ to the hollow shaft 115. A piezoelectric element 135 is provided to drive actuation of the actuator 130 to generate the second force $F_2$. In one example, the first force $F_1$ may comprise a static force (i.e., does not change with time), and the second force $F_2$ may comprise a dynamic force (i.e., does change with time). The hollow shaft 115 is set to move when the second force $F_2$ is greater than the first force $F_1$.

Figure 17:
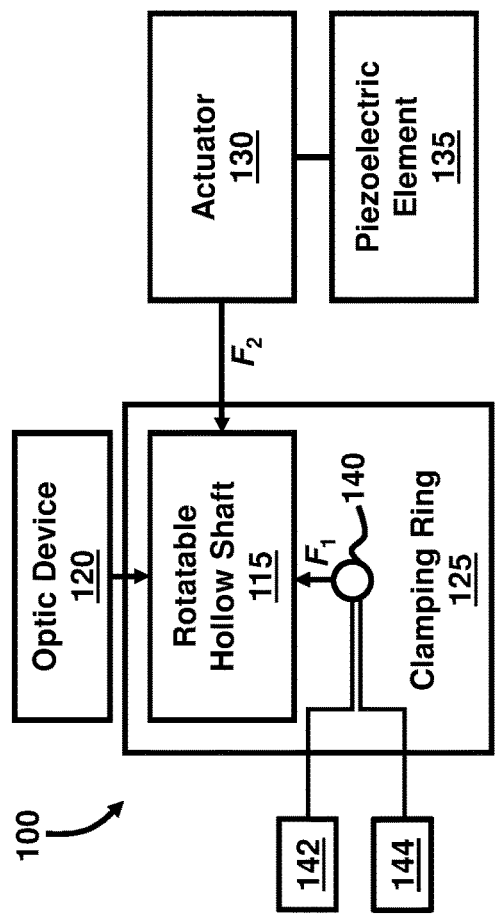
FIG. 17 is a block diagram of a motion control system for generating a force, according to an embodiment herein.

As shown in FIG. 17, with reference to FIGS. 1 through 16, the motion control system 100 may comprise a mechanism 140 to generate the first force $F_1$. The mechanism 140 may comprise a screw 142 to adjust a positioning of the clamping ring 125 against the hollow shaft 115 and control the first force $F_1$, according to an example. Furthermore, the mechanism 140 may comprise a spring 144 to control the first force $F_1$, according to another example.

As shown in the block diagram of FIG. 18, with reference to FIGS. 1 through 17, the movement by the actuator 130 at a first velocity $V_1$ may cause a coefficient of friction between the hollow shaft 115 and the actuator 130 to be a kinetic coefficient of friction that is less than the first force $F_1$ thereby preventing the hollow shaft 115 from rotating. As shown in the block diagram of FIG. 19, with reference to FIGS. 1 through 18, the movement by the actuator 130 at a second velocity $V_2$, lower than the first velocity $V_1$, may cause a coefficient of friction between the hollow shaft 115 and the actuator 130 to be a static coefficient of friction (i.e., does not change with time) that is greater than the first force $F_1$ thereby allowing the hollow shaft 115 to rotate.

FIG. 20, with reference to FIGS. 1 through 19, is a flow diagram illustrating a method 150 comprising inserting (152) a rotatable hollow shaft 115 that accommodates an optic device 120 in a clamping ring 125, the clamping ring 125 comprising an actuator 130; applying (154) a first force $F_1$ to the hollow shaft 115 by tightening the clamping ring 125; generating (156) movement of the actuator 130; applying (158) a second force $F_2$ to the hollow shaft 115 caused by the movement of the actuator 130; and controlling (160) a rotational movement of the hollow shaft 115 based on application of the second force $F_2$.

The clamping ring 125 may be made by milling metal pieces, assembling the pieces together, inserting the optic device 120 into the rotatable hollow shaft 115, fastening the actuator 130 into position, and attaching electrical leads (not shown) to the driving electronics (not shown) to control the piezoelectric element 135. The rotatable hollow shaft 115 holding the optic device 120 is rotated by applying a sawtooth wave function, for example, to the piezoelectric element 135. The direction of rotational movement w is controlled by the polarity of the sawtooth wave function.

As shown in FIGS. 21A and 21B, with reference to FIGS. 1 through 20, the method 150 comprises generating (162) movement of the actuator 130 at a first velocity $V_1$ to cause a coefficient of friction between the hollow shaft 115 and the actuator 130 to be at a first level that prevents the hollow shaft 115 from rotating. Alternatively, the method 150 comprises generating (164) movement of the actuator 130 at a second velocity $V_2$, lower than the first velocity $V_1$, to cause a coefficient of friction between the hollow shaft 115 and the actuator 130 to be at a second level that allows the hollow shaft 115 to rotate. The embodiments herein may be used in applications where precision rotation is required including, robotics, imaging, and photography, for example, and can be placed on any screw head for precision motion and then can be removed after use.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:
1. A piezoelectric rotary optical mount comprising:
a clamp comprising a first hole to hold a hollow member, wherein a contact between the clamp and the hollow member generates a coefficient of friction;

a bias element adjacent to the first hole to apply a force to control rotational movement of the hollow member by adjusting the coefficient of friction; and
a piezoelectric element to actuate the bias element to apply the force.

2. A piezoelectric rotary optical mount comprising:
a clamp comprising a first hole to hold a hollow member, wherein a contact between the clamp and the hollow member generates a coefficient of friction;
a bias element adjacent to the first hole to apply a force to control rotational movement of the hollow member by adjusting the coefficient of friction; and
a piezoelectric element to actuate the bias element to apply the force;
wherein the clamp further comprises:
a housing body comprising a first end and a second end, wherein the first hole extends in a first axis through the housing body to accommodate the hollow member;
a pair of elongated cutout regions extending from the first hole towards the second end to define the bias element; and
a second hole adjacent to at least one of the cutout regions to accommodate the piezoelectric element.

3. The piezoelectric rotary optical mount of claim 2, wherein the clamp comprises:
a pair of prongs at the first end of the housing body;
a gap between the pair of prongs extending to the first hole; and
a bifurcated third hole extending through the pair of prongs in a second axis through the housing body,
wherein the first axis is transverse to the second axis.

4. The piezoelectric rotary optical mount of claim 3, wherein the clamp comprises at least a plurality of apertures in the housing body that do not extend through the housing body.

5. The piezoelectric rotary optical mount of claim 3, comprising a tightening mechanism positioned in the bifurcated third hole to control any of a size of the gap, a size of the first hole, and a contact force between the clamp and the hollow member.

6. The piezoelectric rotary optical mount of claim 2, wherein the bias element comprises an elongated component positioned between the pair of elongated cutout regions and extending from the second end to the first hole.

7. The piezoelectric rotary optical mount of claim 2, wherein the piezoelectric element is set to push against the elongated component to generate the coefficient of friction with respect to the hollow member.

8. The piezoelectric rotary optical mount of claim 7, wherein the elongated component is set to actuate at different velocities to alter the coefficient of friction to control the rotational movement of the hollow member.

9. The piezoelectric rotary optical mount of claim 1, wherein the hollow member is set to accommodate any of an optic device, a cable, a hose, and a screw.

10. A motion control system comprising:
a rotatable hollow shaft to accommodate an optic device;
a clamping ring surrounding and applying a first force to the hollow shaft;
an actuator adjacent to the hollow shaft and attached to the clamping ring, the actuator to apply a second force to the hollow shaft; and
a piezoelectric element to drive actuation of the actuator to generate the second force.

11. The motion control system of claim 10, wherein the first force comprises a static force.

12. The motion control system of claim 10, wherein the second force comprises a dynamic force.

13. The motion control system of claim 10, wherein the hollow shaft is set to move when the second force is greater than the first force.

14. The motion control system of claim 10, comprising a mechanism to generate the first force.

15. The motion control system of claim 14, wherein the mechanism comprises a screw to adjust a positioning of the clamping ring against the hollow shaft and control the first force.

16. The motion control system of claim 14, wherein the mechanism comprises a spring to control the first force.

17. The motion control system of claim 10, wherein movement by the actuator at a first velocity causes a coefficient of friction between the hollow shaft and the actuator to be a kinetic coefficient of friction that is less than the first force thereby preventing the hollow shaft from rotating.

18. The motion control system of claim 17, wherein movement by the actuator at a second velocity, lower than the first velocity, causes a coefficient of friction between the hollow shaft and the actuator to be a static coefficient of friction that is greater than the first force thereby allowing the hollow shaft to rotate.

19. A method comprising:
inserting a rotatable hollow shaft that accommodates an optic device in a clamping ring, the clamping ring comprising an actuator;
applying a first force to the hollow shaft by tightening the clamping ring;
generating movement of the actuator;
applying a second force to the hollow shaft caused by the movement of the actuator; and
controlling a rotational movement of the hollow shaft based on application of the second force.

20. The method of claim 19, comprising:
generating movement of the actuator at a first velocity to cause a coefficient of friction between the hollow shaft and the actuator to be at a first level that prevents the hollow shaft from rotating; or
generating movement of the actuator at a second velocity, lower than the first velocity, to cause a coefficient of friction between the hollow shaft and the actuator to be at a second level that allows the hollow shaft to rotated.

\* \* \* \* \*